(12) United States Patent
Iida et al.

(10) Patent No.: US 7,939,590 B2
(45) Date of Patent: May 10, 2011

(54) COMPOSITION FOR FORMING SILICA-BASED COATING FILM

(75) Inventors: Hiroyuki Iida, Kawasaki (JP); Masaru Takahama, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 274 days.

(21) Appl. No.: 11/911,339

(22) PCT Filed: Mar. 16, 2006

(86) PCT No.: PCT/JP2006/305291
§ 371 (c)(1),
(2), (4) Date: Oct. 11, 2007

(87) PCT Pub. No.: WO2006/112230
PCT Pub. Date: Oct. 26, 2006

(65) Prior Publication Data
US 2009/0018247 A1    Jan. 15, 2009

(30) Foreign Application Priority Data

Apr. 13, 2005 (JP) ................................ 2005-116281
Apr. 13, 2005 (JP) ................................ 2005-116282

(51) Int. Cl.
*A61Q 19/00* (2006.01)
*C08J 3/07* (2006.01)
*C08J 7/00* (2006.01)
*C08K 5/54* (2006.01)

(52) U.S. Cl. ........ 524/268; 524/236; 524/500; 524/423; 428/447; 521/50; 521/81

(58) Field of Classification Search .................. 524/423, 524/236, 500, 268; 428/447
See application file for complete search history.

(56) References Cited

U.S. PATENT DOCUMENTS

| | | | |
|---|---|---|---|
| 6,472,079 B2 * | 10/2002 | Hayashi et al. | 428/447 |
| 2004/0077757 A1 * | 4/2004 | Araki et al. | 524/264 |
| 2004/0188809 A1 * | 9/2004 | Ogihara et al. | 257/642 |
| 2004/0201007 A1 | 10/2004 | Yagihashi et al. | |
| 2004/0216641 A1 * | 11/2004 | Hamada et al. | 106/287.16 |
| 2006/0047034 A1 * | 3/2006 | Sakurai et al. | 524/236 |

FOREIGN PATENT DOCUMENTS

| | | |
|---|---|---|
| CN | 1536024 | 10/2004 |
| JP | H05-139714 A | 6/1993 |
| JP | H06-172709 A | 6/1994 |
| JP | H11-50007 A | 2/1999 |
| JP | 2001-206710 A | 7/2001 |
| JP | 2002-201415 | 7/2002 |
| JP | 2002-220565 A | 8/2002 |
| JP | 2003-64307 A | 3/2003 |
| JP | 2004-161877 | 6/2004 |
| JP | 2004-277501 A | 10/2004 |

OTHER PUBLICATIONS

Office Action issued on counterpart Korean Patent Application No. 10-2007-7024042, dated Mar. 31, 2009.
International Search Report from PCT/JP2006/305291 dated Apr. 18, 2006.
Office Action issued on counterpart Chinese Patent Application No. 200680011763.X, dated Jul. 10, 2009.

* cited by examiner

*Primary Examiner* — James Seidleck
*Assistant Examiner* — Deve Valdez
(74) *Attorney, Agent, or Firm* — Knobbe, Martens, Olson & Bear, LLP

(57) ABSTRACT

A composition for forming a silica-based coating film includes a siloxane polymer and an alkali metal compound. The siloxane polymer is preferably a hydrolysis-condensation product of a silane compound having a hydrolyzable group. Sodium, lithium, potassium, rubidium, or cesium, or the like is used as the alkali metal of the alkali metal compound. Furthermore, the alkali metal compound is preferably a nitrate, sulfate, carbonate, oxide, chloride, bromide, fluoride, iodide, or hydroxide of the above alkali metal. This composition for forming a silica-based coating film may also include a pore-forming material. At least one material selected from amongst polyalkylene glycols and alkyl-terminated derivatives thereof is used as the pore-forming material.

5 Claims, No Drawings

COMPOSITION FOR FORMING SILICA-BASED COATING FILM

RELATED APPLICATIONS

This application is the U.S. National Phase filing under 35 U.S.C. §371 of PCT/JP2006/305291, filed Mar. 16, 2006, which designated the United States and was published in a language other than English, which claims priority under 35 U.S.C. §119(a)-(d) to Japanese Patent Application No. 2005-116281, filed Apr. 13, 2005, and to Japanese Patent Application No. 2005-116282, filed Apr. 13, 2005. The content of these applications is incorporated herein by reference in their entireties.

TECHNICAL FIELD

The present invention relates to a composition for forming a silica-based coating film that is capable of forming an interlayer insulating film or the like within a semiconductor element.

BACKGROUND ART

Conventionally, silica-based coating films have been widely used as planarized films and interlayer insulating films within semiconductor elements such as LSI (large-scale integration) elements. These types of silica-based coating films are formed by chemical vapor deposition methods (CVD methods) and spin coating methods and the like. Because of their simplicity, methods in which the silica-based coating film is formed using a spin coating method are particularly widely employed.

Demands for ever greater integration of the above semiconductor elements such as LSI elements continue to grow. However, this increased integration leads to increasingly finer wiring, which results in increased wiring capacity that can cause problems of longer signal delay times. In order to address these types of problems, materials capable of forming silica-based coating films with lower dielectric constants are required.

In order to achieve this type of reduction in the dielectric constant, patent reference 1 discloses the addition of a thermally decomposable, volatile organic polymer for the purpose of pore formation, thereby converting the formed silica-based coating film to a porous state.

[Patent Reference 1]
Japanese Unexamined Patent Application, First Publication No. 2002-201415

DISCLOSURE OF INVENTION

However, even with the conventional silica-based coating films described above, an ideal dielectric constant is still unobtainable, and even lower dielectric constants are required. Furthermore, when a silica-based coating film is converted to a porous state in the manner described above, the problem in that mechanical strength is deteriorated occurs. Moreover, silica-based coating films also require superior electrical properties with a low leakage current, and excellent uniformity of the film thickness.

The present invention takes the above circumstances into consideration, with an object of providing a composition for forming a silica-based coating film that is capable of forming a silica-based coating film with a low dielectric constant.

Furthermore, another object of the present invention is to provide a composition for forming a silica-based coating film that is capable of forming a silica-based coating film with a low dielectric constant and a high degree of mechanical strength.

Furthermore, yet another object of the present invention is to provide a composition for forming a silica-based coating film that is capable of forming a silica-based coating film with a low dielectric constant, favorable electrical properties, and favorable uniformity of the film thickness.

In order to achieve the above objects, the present invention adopts the features described below.

A first aspect of the present invention is a composition for forming a silica-based coating film that includes a siloxane polymer and an alkali metal compound.

Furthermore, a second aspect of the present invention is a composition for forming a silica-based coating film that includes a siloxane polymer, an alkali metal compound, and a pore-forming material.

A composition for forming a silica-based coating film of the present invention is capable of forming a silica-based coating film with a low dielectric constant.

In particular, a composition for forming a silica-based coating film according to the first aspect of the present invention is capable of forming a silica-based coating film with a low dielectric constant and a high degree of mechanical strength.

In particular, a composition for forming a silica-based coating film according to the second aspect of the present invention is capable of forming a silica-based coating film with a low dielectric constant, favorable electrical properties, and a high degree of uniformity in the film thickness.

BEST MODE FOR CARRYING OUT THE INVENTION (First Aspect)

A composition for forming a silica-based coating film according to the first aspect of the present invention includes a siloxane polymer and an alkali metal compound.

The siloxane polymer used in the present invention is a polymer in which SiO units constitute the main backbone. Examples of this siloxane polymer include at least one hydrolysis-condensation product of a compound represented by a general formula (1) shown below:

$$R_n SiX_{4-n} \quad (1)$$

(wherein, R represents H or a monovalent organic group, X represents a hydrolyzable group, n represents an integer from 0 to 2, the plurality of R groups may be either the same or different, and the plurality of X groups may be either the same or different).

Moreover, the compound represented by the general formula (1) preferably includes the compound in which n=0. This enables the mechanical strength to be further enhanced.

Furthermore, in those cases where n=1 or 2, the use of compounds in which the R groups are monovalent organic groups is preferred.

Examples of the above monovalent organic groups represented by R include organic groups of 1 to 20 carbon atoms. Specific examples of these organic groups include alkyl groups such as a methyl group, ethyl group or propyl group; alkenyl groups such as a vinyl group, allyl group or propenyl group; aryl groups such as a phenyl group or tolyl group; aralkyl groups such as a benzyl group or phenylethyl group; epoxy-containing groups such as a glycidyl group or glycidyloxy group; an amino group, and groups that have been substituted with an amino-containing group such as alkylamino groups. Of these groups, groups of 1 to 6 carbon atoms such as a methyl group, ethyl group, propyl group or phenyl group are preferred, a methyl group or phenyl group is particularly preferred, and a methyl group is the most desirable.

Examples of the above hydrolyzable groups represented by X include alkoxy groups such as a methoxy group, ethoxy group, propoxy group, isopropoxy group, butoxy group, sec-butoxy group or t-butoxy group; alkenoxy groups such as a vinyloxy group or 2-propenoxy group; a phenoxy group; acyloxy groups such as an acetoxy group; oxime groups such as a butanoxime group; and an amino group. Of these groups, alkoxy groups of 1 to 5 carbon atoms are preferred, and in terms of ease of control during hydrolysis and condensation, a methoxy group, ethoxy group, isopropoxy group or butoxy group is the most desirable.

There are no particular restrictions on the weight average molecular weight (Mw) (the polystyrene equivalent molecular weight determined by gel permeation chromatography (GPC), this also applies to subsequent molecular weight values) of the above reaction product, although a molecular weight within a range from 1,000 to 10,000 is preferred, and molecular weights from 1,000 to 5,000 are particularly desirable. The reaction product refers to the above siloxane polymer, namely, at least one hydrolysis-condensation product of a compound represented by the general formula (1).

Specific examples of compounds represented by the general formula (1) include trifunctional silane compounds such as trimethoxysilane, triethoxysilane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, and fluorotriphenoxysilane; and tetrafunctional silane compounds such as tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetraphenoxysilane (namely, compounds in which n=0)

trifunctional silane compounds (compounds in which n=1) such as methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilang, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, i-propyltriethoxysilane, i-propyltri-n-propoxysilane, i-propyltri-iso-propoxysilane, i-propyltri-n-butoxysilane, i-propyltri-sec-butoxysilane, i-propyltri-tert-butoxysilane, i-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltri-iso-propoxysilane, sec-butyltri-n-butoxysilane, sec-butyltri-sec-butoxysilane, sec-butyltri-tert-butoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and bifunctional silane compounds (compounds in which n=2) such as dimethyldimethoxysilane, dimethyldiethoxysilane, dimethyl-di-n-propoxysilane, dimethyl-di-iso-propoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyl-di-iso-propoxysilane, diethyl-di-n-butoxysilane, diethyl-di-sec-butoxysilane, diethyl-di-tert-butoxysilane, diethyldiphenoxysilane, di-n-propyldimethoxysilane, di-n-propyldiethoxysilane, di-n-propyl-di-n-propoxysilane, di-n-propyl-di-iso-propoxysilane, di-n-propyl-di-n-butoxysilane, di-n-propyl-di-sec-butoxysilane, di-n-propyl-di-tert-butoxysilane, di-n-propyl-diphenoxysilane, di-iso-propyldimethoxysilane, di-iso-propyldiethoxysilane, di-iso-propyl-di-n-propoxysilane, di-iso-propyl-di-iso-propoxysilane, di-iso-propyl-di-n-butoxysilane, di-iso-propyl-di-sec-butoxysilane, di-iso-propyl-di-tert-butoxysilane, di-iso-propyl-diphenoxysilane, di-n-butyldimethoxysilane, di-n-butyldiethoxysilane, di-n-butyl-di-n-propoxysilane, di-n-butyl-di-iso-propoxysilane, di-n-butyl-di-n-butoxysilane, di-n-butyl-di-sec-butoxysilane, di-n-butyl-di-tert-butoxysilane, di-n-butyl-diphenoxysilane, di-sec-butyldimethoxysilane, di-sec-butyldiethoxysilane, di-sec-butyl-di-n-propoxysilane, di-sec-butyl-di-iso-propoxysilane, di-sec-butyl-di-n-butoxysilane, di-sec-butyl-di-sec-butoxysilane, di-sec-butyl-di-tert-butoxysilane, di-sec-butyl-diphenoxysilane, di-tert-butyldimethoxysilane, di-tert-butyldiethoxysilane, di-tert-butyl-di-n-propoxysilane, di-tert-butyl-di-iso-propoxysilane, di-tert-butyl-di-n-butoxysilane, di-tert-butyl-di-sec-butoxysilane, di-tert-butyl-di-tert-butoxysilane, di-tert-butyl-diphenoxysilane, diphenyldimethoxysilane, diphenyldiethoxysilane, diphenyl-di-n-propoxysilane, diphenyl-di-iso-propoxysilane, diphenyl-di-n-butoxysilane, diphenyl-di-sec-butoxysilane, diphenyl-di-tert-butoxysilane, diphenyldiphenoxysilane, divinyldimethoxysilane, di-γ-aminopropyldimethoxysilane, di-γ-aminopropyldiethoxysilane, di-γ-glycidoxypropyldimethoxysilane, di-γ-glycidoxypropyldiethoxysilane, di-γ-trifluoropropyldimethoxysilane, and di-γ-trifluoropropyldiethoxysilane. These compounds may be used either alone, or in mixtures containing two or more different compounds.

Of the above compounds (1), preferred tetrafunctional silane compounds include tetramethoxysilane, tetraethoxysilane, tetra-n-propoxysilane, tetra-iso-propoxysilane and tetraphenoxysilane, preferred trifunctional silane compounds include methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane and phenyltriethoxysilane, and preferred bifunctional compounds include dimethyldimethoxysilane, dimethyldiethoxysilane, diethyldimethoxysilane, diethyldiethoxysilane, diphenyldimethoxysilane and diphenyldimethoxysilane.

Furthermore, trimethylmonomethoxysilane, trimethylmonoethoxysilane, triethylmonomethoxysilane, triethylmonoethoxysilane, triphenylmonomethoxysilane, and triphenylmonoethoxysilane may also be used.

The compound of the above general formula (1) can be converted to a siloxane polymer by hydrolysis and partial condensation within an organic solvent, by mixing the compound with water and a catalyst.

Suitable examples of this organic solvent include the organic solvents listed below that are typically used in compositions for forming silica-based coating films.

Furthermore, examples of suitable catalysts include organic acids, inorganic acids, organic bases and inorganic bases.

Examples of suitable organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid.

Examples of suitable inorganic acids include hydrochloric acid, nitric acid, sulfuric acid, hydrofluoric acid, and phosphoric acid.

Furthermore, examples of suitable organic bases include methanolamine, ethanolamine, propanolamine, butanolamaine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmethanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanolamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, and diazabicycloundecene.

Examples of suitable inorganic bases include ammonia, sodium hydroxide, potassium hydroxide, barium hydroxide, and calcium hydroxide.

Of these catalysts, acid catalysts are preferred. Preferred organic acids include carboxylic acids such as formic acid, oxalic acid, fumaric acid, maleic acid, glacial acetic acid, acetic anhydride, propionic acid and n-butyric acid, as well as organic acids having a sulfur-containing acid residue. Specific examples of organic acids having a sulfur-containing acid residue include organic sulfonic acids, and esterified products of these acids include organic sulfate esters and organic sulfite esters. Of these possibilities, organic sulfonic acids such as compounds represented by a general formula (2) shown below are preferred.

$$R^1\text{—}Y \qquad (2)$$

(wherein, $R^1$ represents a hydrocarbon group that may contain a substituent group, and Y represents a sulfonic acid group)

In the above general formula (2), the hydrocarbon group represented by $R^1$ is preferably a hydrocarbon group of 1 to 20 carbon atoms, and this hydrocarbon group may be either saturated or unsaturated, and may have a straight-chain, branched, or cyclic structure.

In those cases where the hydrocarbon group of $R^1$ is a cyclic group, an aromatic hydrocarbon group such as a phenyl group, naphthyl group or anthryl group is preferred, and a phenyl group is particularly desirable. Either one, or a plurality of hydrocarbon groups of 1 to 20 carbon atoms may be bonded as substituent groups to the aromatic ring within this aromatic hydrocarbon group. These hydrocarbon substituent groups on the aromatic ring may be either saturated or unsaturated, and may have a straight-chain, branched, or cyclic structure.

The hydrocarbon group of $R^1$ may include one or more substituent groups, and examples of suitable substituent groups include halogen atoms such as a fluorine atom, a sulfonic acid group, carboxyl group, hydroxyl group, amino group, or cyano group.

From the viewpoint of achieving a favorable improvement in the shape of the lower portion of a resist pattern formed on top of the silica-based coating film, the organic sulfonic acid represented by the general formula (2) is preferably nonafluorobutanesulfonic acid, methanesulfonic acid, trifluoromethanesulfonic acid, dodecylbenzenesulfonic acid, or a mixture thereof.

The quantity used of the above catalyst is preferably adjusted so that, for example, the concentration of the catalyst within the reaction system for the hydrolysis reaction is within a range from 1 to 1,000 ppm, and even more preferably from 5 to 800 ppm.

Furthermore, the quantity of water added is preferably within a range from 1.5 to 4.0 mols per 1 mol of hydrolyzable groups within the total quantity of the compound of the general formula (1).

Furthermore, when the compound of the general formula (1) is subjected to a hydrolysis reaction, the alcohol produced by the hydrolysis is preferably removed. By removing the alcohol produced by the hydrolysis, the storage stability and film-forming properties of the composition can be improved. Removal of the alcohol is preferably conducted by a method that employs distillation under reduced pressure. This reduced pressure distillation is typically conducted at a degree of vacuum within a range from $39.9\times10^2$ to $39.9\times10^3$ Pa (approximately 30 to 300 mmHg), and preferably from $66.5\times10^2$ to $26.6\times10^3$ Pa (approximately 50 to 200 mmHg), at a temperature within a range from 20 to 100° C. The alcohol produced by the hydrolysis is preferably removed until the quantity of residual alcohol within the composition for forming a silica-based coating film is no more than 30% by weight, even more preferably no more than 15% by weight, and most preferably no more than 8% by weight.

The composition for forming a silica-based coating film of the present invention contains an alkali metal compound. By including this alkali metal compound, the dielectric constant of the silica-based coating film formed from the composition for forming the silica-based coating film can be reduced, enabling the mechanical strength to be improved. Moreover, by including this alkali metal compound, the storage stability of the composition for forming the silica-based coating film can also be improved. In addition, degassing of the composition for forming the silica-based coating film can also be suppressed.

Examples of the alkali metal within this alkali metal compound include sodium, lithium, potassium, rubidium, and cesium. Of these, rubidium and cesium are preferred as they yield lower dielectric constants. In other words, the alkali metal compound is preferably a rubidium compound or a cesium compound.

Examples of the alkali metal compound include organic acid salts, inorganic acid salts, alkoxides, oxides, nitrides, halides (such as chlorides, bromides, fluorides and iodides), and hydroxides of the above alkali metals.

Examples of the above organic acids include formic acid, oxalic acid, acetic acid, propionic acid, butyric acid, valeric acid, capric acid, heptanoic acid, 2-ethylhexanoic acid, cyclohexanoic acid, cyclohexanepropionic acid, cyclohexaneacetic acid, nonanoic acid, malic acid, glutamic acid, leucine acid, hydroxypivalic acid, pivalic acid, glutaric acid, adipic acid, cyclohexanedicarboxylic acid, pimelic acid, suberic acid, ethylbutyric acid, benzoic acid, phenylacetic acid, phenylpropionic acid, hydroxybenzoic acid, caprylic acid, lauric acid, myristic acid, palmitic acid, stearic acid, alginic acid, oleic acid, elaidic acid, linoleic acid, and ricinoleic acid.

Examples of the above inorganic acids include nitric acid, sulfuric acid, hydrochloric acid, carbonic acid, and phosphoric acid.

Furthermore, examples of suitable alkoxides include a methoxide, ethoxide, propoxide, and butoxide.

The alkali metal compound is preferably selected from the group consisting of alkali metal nitrates, sulfates, carbonates, oxides, chlorides, bromides, fluorides, iodides, and hydroxides.

Of these, the alkali metal compound is most preferably an inorganic acid salt or halide of the alkali metal, and is most preferably a nitrate. Rubidium nitrate is particularly preferred as the alkali metal compound.

The alkali metal compound is preferably added in a quantity within a range from 1 to 1,000,000 ppm (0.0001 to 100 wt %) relative to the siloxane polymer (the solid fraction (calculated as an equivalent weight of $SiO_2$)) within the composition for forming a silica-based coating film, and this quantity is even more preferably within a range from 10 to 100,000 ppm (0.001 to 10 wt %), and is most preferably from 100 to 10,000 ppm (0.01 to 1 wt %). Ensuring a quantity within this range enables the effects of the invention to be further enhanced.

The composition for forming a silica-based coating film according to the present invention preferably includes a solvent such as water or an organic solvent. Examples of suitable organic solvents include aliphatic hydrocarbon-based solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon-based solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol-based solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbitol, diacetone alcohol, and cresol; polyhydric alcohol-based solvents such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketone-based solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-1-butyl ketone, trimethylnonanone, cyclohexanone, methylcyclohexanone, 2,4-pentanedione, acetonylacetone, diacetone alcohol, acetophenone, and fenchone; ether-based solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester-based solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents may be used either alone, or in mixtures of two or more different solvents.

There are no particular restrictions on the quantity of solvent used in the present invention, but the solvent quantity is preferably adjusted so that the total solid fraction concentration within the composition for forming a silica-based coating film is within a range from 1 to 30% by weight, and even more preferably from 5 to 25% by weight. By ensuring a concentration within this range, the thickness of the coating film can be set within an appropriate range, and the storage stability of the composition can also be improved.

Furthermore, the solvent preferably incorporates a compound capable of dissolving the alkali metal compound, and a hydrophilic solvent is particularly desirable. Examples of hydrophilic solvents include acetone, lower alcohols such as methanol, ethanol, n-propanol, i-propanol, n-butanol and i-butanol, and water. These hydrophilic solvents preferably represent from 1 to 100% by weight, and even more preferably from 5 to 30% by weight, of the total quantity of solvent used.

Furthermore, a surfactant may also be added to the composition for forming a silica-based coating film of the present invention in order to improve the coating properties and prevent striations. Examples of the surfactant include nonionic surfactants, anionic surfactants, cationic surfactants and amphoteric surfactants, as well as silicone-based surfactants, polyalkylene oxide-based surfactants and poly(meth)acrylate-based surfactants.

The composition for forming a silica-based coating film according to the present invention can be used favorably for the formation of interlayer insulating films for semiconductor elements such as LSI, LCD systems (Liquid Crystal Devices or Liquid Crystal Displays), DRAM (Dynamic Random Access Memory), SDRAM (Synchronous DRAM), RDRAM (Rambus DRAM) and D-RDRAM (Direct DRAM), as protective films such as surface coatings for the semiconductor elements, as interlayer insulating films for multilayer wiring boards, or as protective films or insulation prevention films for liquid crystal display elements.

Examples of methods of forming a silica-based coating film using the composition for forming a silica-based coating film according to the present invention include, for example, the method described below.

For example, first the composition for forming a silica-based coating film is applied to a substrate using a method such as spin coating, flow casting or roll coating, in sufficient quantity to yield a coating film with the desired film thickness. The thickness of the coating film may be selected as appropriate.

Subsequently, the substrate on which the coating film has been formed is baked on a hotplate. This baking treatment causes the organic solvent within the coating film to volatilize, and also causes reaction between the molecules of the siloxane polymer, thereby effecting a polymerization. The baking temperature is typically within a range from 80 to 500° C., and is preferably from 80 to 300° C. The baking treatment may also be conducted over a plurality of stages in which the baking temperature is changed.

Subsequently, the film is fired at a high temperature, thus yielding a silica-based coating film. The firing temperature is typically at least 350° C., and is preferably within a range from 350 to 450° C.

(Second Aspect)

A composition for forming a silica-based coating film according to the second aspect of the present invention includes a siloxane polymer, an alkali metal compound, and a pore-forming material.

The siloxane polymer used in the second aspect is a polymer in which SiO units constitute the main backbone, in the same manner as was described for the first aspect. In the same manner as was described for the first aspect, examples of this siloxane polymer include at least one hydrolysis-condensation product of a compound represented by the above general formula (1).

In the same manner as that described for the first aspect, the compound of the general formula (1) of the second aspect can be converted to a siloxane polymer by hydrolysis and partial condensation within an organic solvent, by mixing the compound with water and a catalyst.

Examples of the organic solvent include the same organic solvents as those exemplified for the first aspect.

Furthermore, examples of the catalyst include the same organic acids, inorganic acids, organic bases, and inorganic bases as those exemplified for the first aspect.

The composition for forming a silica-based coating film according to the second aspect of the present invention contains an alkali metal compound. The alkali metal compound may employ either a single compound, or a combination of two or more different compounds. By including this alkali metal compound, the dielectric constant of the silica-based coating film formed from the composition for forming the silica-based coating film can be reduced, the electrical properties can be improved, and the uniformity of the film thickness can be improved.

Moreover, by including this alkali metal compound, the storage stability of the composition for forming the silica-based coating film can also be improved. In addition, degassing of the composition for forming the silica-based coating film can also be suppressed.

Examples of the alkali metal within this alkali metal compound include sodium, lithium, potassium, rubidium, and cesium, as was the case in the first aspect. Of these, rubidium and cesium are preferred as they yield lower dielectric constants.

Suitable examples of the alkali metal compound include the same compounds as those described for the first aspect, including organic acid salts, inorganic acid salts, alkoxides, oxides, nitrides, halides (such as chlorides, bromides, fluorides and iodides), and hydroxides of the above alkali metals.

The alkali metal compound is preferably added in a quantity within a range from 1 to 1,000,000 ppm (0.0001 to 100 wt %) relative to the siloxane polymer (the solid fraction (calculated as an equivalent weight of $SiO_2$)) within the composition for forming a silica-based coating film, and this quantity is even more preferably within a range from 10 to 100,000 ppm (0.001 to 10 wt %), and is most preferably from 100 to 10,000 ppm (0.01 to 1 wt %). Ensuring a quantity within this range enables the effects of the invention to be further enhanced.

The composition for forming a silica-based coating film according to the second aspect of the present invention preferably contains a solvent such as water or an organic solvent. Examples of suitable organic solvents include the same solvents exemplified above for the first aspect, and these solvents may be used either alone, or in mixtures of two or more different solvents.

There are no particular restrictions on the quantity of solvent used in the present invention, but the solvent quantity is preferably adjusted so that the total solid fraction concentration within the composition for forming a silica-based coating film is within a range from 1 to 30% by weight, and even more preferably from 5 to 25% by weight. By ensuring a concentration within this range, the thickness of the coating film can be set within an appropriate range, and the storage stability of the composition can also be improved.

Furthermore, the solvent preferably incorporates a compound capable of dissolving the alkali metal compound, and a hydrophilic solvent is particularly desirable. Examples of suitable hydrophilic solvents include the same solvents as those exemplified above for the first aspect. These hydrophilic solvents preferably represent from 1 to 100% by weight, and even more preferably from 5 to 30% by weight, of the total quantity of solvent used.

The composition for forming a silica-based coating film according to the second aspect of the present invention also contains a pore-forming material. This pore-forming material is a material that volatilizes or decomposes upon heating, thereby forming pores within the silica-based coating film formed from the composition for forming the silica-based coating film. Examples of the pore-forming material include polyalkylene glycols and alkyl-terminated derivatives thereof, monosaccharides, disaccharides, polysaccharides and derivatives thereof (these monosaccharides, disaccharides, polysaccharides and derivatives thereof are preferably formed from between one and 22 6-carbon monosaccharides or derivatives thereof), and organic peroxides such as benzoyl peroxide that generate a gas upon self-decomposition. These pore-forming materials may be used either alone, or in mixtures of two or more different compounds.

The pore-forming material is preferably one or more materials selected from the group consisting of polyalkylene glycols and alkyl-terminated derivatives thereof.

The number of carbon atoms of the alkylene group within the polyalkylene glycol is preferably within a range from 1 to 5, and is even more preferably from 1 to 3. Specific examples thereof include lower alkylene glycols such as polyethylene glycol and polypropylene glycol.

Alkyl-terminated derivatives of polyalkylene glycols are compounds in which the hydroxyl groups at either one terminal or both terminals of the polyalkylene glycol have been alkoxylated with alkyl groups. The alkyl group used in this alkoxylation of the terminals may be either a straight-chain or branched alkyl group, and the number of carbon atoms within the alkyl group is preferably within a range from 1 to 5, and even more preferably from 1 to 3. Particularly preferred alkyl groups include straight-chain alkyl groups such as a methyl group, ethyl group or propyl group.

These polyalkylene glycols and alkyl-terminated derivatives thereof preferably have a weight average molecular weight (Mw) within a range from 100 to 10,000, and this molecular weight is even more preferably from 200 to 5,000, and is most preferably from 400 to 4,000. By ensuring that the Mw value is no larger than the upper limit of the above range, favorable coating properties can be achieved with no loss in the co-solubility of the composition, and the uniformity of the film thickness of the silica-based coating film can be improved. Ensuring the Mw value is at least as large as the lower limit enables the formation of a more porous silica-based coating film, enabling a lower dielectric constant.

The quantity used of the pore-forming material is preferably within a range from 25 to 200% by weight, and even more preferably from 30 to 70% by weight, relative to the solid fraction of the composition for forming a silica-based coating film (calculated as an equivalent weight of $SiO_2$). Ensuring that the quantity used of the pore-forming material is at least as large as the lower limit of the above range enables a greater reduction in the dielectric constant of the silica-based coating film. Furthermore, ensuring the quantity used of the pore-forming material is no larger than the upper limit enables the mechanical strength of the formed silica-based coating film to be improved.

A silica-based coating film formed using the composition for forming a silica-based coating film according to the second aspect has a dielectric constant that is preferably no greater than 3.0, and even more preferably 2.5 or less. As described above, by adding the pore-forming material and an alkali metal compound to the composition for forming a silica-based coating film, a dielectric constant that falls within this desired range can be achieved.

Furthermore, a silica-based coating film formed using the composition for forming a silica-based coating film according to the second aspect has a leakage current that is preferably no greater than $1.0\times10^{-7}$, and even more preferably $1.0\times10^{-8}$ or less.

Furthermore, a surfactant may also be added to the composition for forming a silica-based coating film according to the second aspect of the present invention in order to improve the coating properties and prevent striations. Examples of the surfactant include the same surfactants as those exemplified above in relation to the first aspect.

An example of a method of preparing the composition for forming a silica-based coating film according to the present invention involves subjecting an alkyltrialkoxysilane to a hydrolysis reaction in the presence of water and an aforementioned acid catalyst, thereby obtaining a reaction solution that contains a siloxane polymer as a reaction product (A) (namely, a reaction solution containing a siloxane polymer). By subsequently adding a pore-forming material as a component (B) and an alkali metal compound as a component (C) to this reaction solution, and then also adding a diluting solvent as required, a composition for forming a silica-based coating film is obtained.

In a similar manner to that described for the first aspect, the composition for forming a silica-based coating film according to the second aspect of the present invention can be used favorably for the formation of interlayer insulating films for semiconductor elements such as LSI, LCD systems, DRAM, SDRAM, RDRAM and D-RDRAM, as protective films such as surface coatings for the semiconductor elements, as interlayer insulating films for multilayer wiring boards, or as protective films or insulation prevention films for liquid crystal display elements. A method of forming a silica-based coating film using the composition for forming a silica-based coating film according to the second aspect of the present invention is the same as the method of the first aspect, with the exception of the difference in the composition for forming the silica-based coating film.

EXAMPLES

Example 1

220.0 g of methyltrimethoxysilane, 246.0 g of tetramethoxysilane, and 301.0 g of propylene glycol monopropyl ether were mixed together and stirred thoroughly. To the resulting mixture were added 204.0 g of water and 52 µl of a nitric acid solution with a concentration of 60% by weight and the mixture was then stirred for 3 hours. Subsequently, the mixture was reacted for two days at room temperature, yielding a reaction solution that contained a reaction product. The weight average molecular weight (Mw) of the reaction product was 1,300.

8.0 g of the thus obtained reaction solution was mixed with 11.8 g of propylene glycol monopropyl ether and 0.2 g of a 0.1% propylene glycol monopropyl ether solution of sodium ethoxide (NaOEt), yielding a composition for forming a silica-based coating film.

The composition for forming a silica-based coating film obtained in the manner described above was applied to the surface of a silicon wafer using spin coating, and a baking treatment was then conducted using a hotplate. The heating conditions used during the baking treatment involved stepwise baking, wherein baking was conducted at 80° C. for one minute, subsequently conducted at 150° C. for one minute, and then conducted at 200° C. for one minute. The structure was then fired in a nitrogen atmosphere at 400° C. for 30 minutes, yielding a silica-based coating film with a film thickness of approximately 2,500 Å (250 nm).

Measurement of the dielectric constant of the thus obtained silica-based coating film using a mercury probe CV measuring apparatus (product name: SSM 495, manufactured by SSM Japan, Inc.) revealed a result of 3.2.

Furthermore, measurement of the elastic modulus of the thus obtained silica-based coating film using a "Nano Indenter XP-SA2" apparatus manufactured by MTS Systems Corporation revealed a result of 16.2 GPa.

Example 2

With the exception of replacing the 0.1% propylene glycol monopropyl ether solution of sodium ethoxide from the example 1 with 0.2 g of a 0.1% aqueous solution of NaCl, a composition for forming a silica-based coating film was obtained in the same manner as the example 1.

Using this composition for forming a silica-based coating film, the same procedure as the example 1 was used to form a silica-based coating film with a film thickness of approximately 2,500 Å (250 nm).

The dielectric constant of the thus obtained silica-based coating film was 3.2.

Furthermore, the elastic modulus of the thus obtained silica-based coating film was 16.2 GPa.

Example 3

With the exception of replacing the 0.1% propylene glycol monopropyl ether solution of sodium ethoxide from the example 1 with 1.6 g of a 0.1% aqueous solution of lithium acetate (LiOAc) and 2.4 µl of a nitric acid solution with a concentration of 60% by weight, a composition for forming a silica-based coating film was obtained in the same manner as the example 1.

Using this composition for forming a silica-based coating film, the same procedure as the example 1 was used to form a silica-based coating film with a film thickness of approximately 2,500 Å (250 nm).

The dielectric constant of the thus obtained silica-based coating film was 3.6.

Furthermore, the elastic modulus of the thus obtained silica-based coating film was 15.1 GPa.

Comparative Example 1

With the exception of not adding the 0.1% propylene glycol monopropyl ether solution of sodium ethoxide, a composition for forming a silica-based coating film was obtained in the same manner as the example 1.

Using this composition for forming a silica-based coating film, the same procedure as the example 1 was used to form a silica-based coating film with a film thickness of approximately 2,500 Å (250 nm).

The dielectric constant of the thus obtained silica-based coating film was 4.4.

Furthermore, the elastic modulus of the thus obtained silica-based coating film was 12.8 GPa.

Comparative Example 2

With the exception of replacing the 0.1% propylene glycol monopropyl ether solution of sodium ethoxide from the example 1 with a 0.1% aqueous solution of $Ca(NO_3)_2$, a composition for forming a silica-based coating film was obtained in the same manner as the example 1.

Using this composition for forming a silica-based coating film, the same procedure as the example 1 was used to form a silica-based coating film with a film thickness of approximately 2,500 Å (250 nm).

The dielectric constant of the thus obtained silica-based coating film was 4.5.

Furthermore, the elastic modulus of the thus obtained silica-based coating film was 12.7 GPa.

As shown above, it is evident that in the compositions for forming silica-based coating films of the examples 1 to 3, which contained an added alkali metal compound, the dielectric constant was able to be reduced, the elastic modulus was able to be increased, and the mechanical strength was able to be improved. As shown in the comparative example 1, a composition for forming a silica-based coating film that contains no added alkali metal compound yields a coating film that exhibits a higher dielectric constant and lower elastic modulus and mechanical strength than the coating films of the examples 1 to 3. Furthermore, as shown in the comparative example 2, it is clear that the addition of an alkaline earth metal compound yields almost no effect.

Example 4

128.8 g of methyltrimethoxysilane, 144.0 g of tetramethoxysilane, and 391.6 g of acetone were mixed together and stirred thoroughly. To the resulting mixture were added 238.7 g of water and 20.5 µl of a nitric acid solution with a concentration of 60% by weight, and the mixture was then stirred to effect the hydrolysis reaction. The reaction yielded a solution A.

To 100 g of the above solution A were added 6.3 g (50% by weight relative to the solid fraction of the solution) of a polypropylene glycol with a weight average molecular weight of 1,000 (product name: NEWPOL PP-1000, manufactured by Sanyo Chemical Industries, Ltd.), followed by 3.8 g of a 0.1% by weight aqueous solution of $RbNO_3$ (equivalent to a $RbNO_3$ concentration of 300 ppm relative to the solid fraction). Subsequently, 76.4 g of acetone and 152.8 g of isopropyl alcohol were added, and the resulting mixture was stirred thoroughly, yielding a composition for forming a silica-based coating film in which the solid fraction concentration had been adjusted to 3% by weight.

The composition for forming a silica-based coating film obtained in this manner was applied to the surface of a silicon wafer using spin coating, and a baking treatment was then conducted using a hotplate. The heating conditions used during the baking treatment involved stepwise baking, wherein baking was conducted at 80° C. for one minute, subsequently conducted at 150° C. for one minute, and then conducted at 250° C. for one minute. The structure was then fired in a nitrogen atmosphere at 400° C. for 30 minutes, yielding a silica-based coating film with a film thickness of approximately 2,500 Å (250 nm).

Measurement of the dielectric constant of the thus obtained silica-based coating film using a mercury probe CV measuring apparatus (product name: SSM 495, manufactured by SSM Japan, Inc.) revealed a result of 2.28, and the leakage current at 2 MV/cm was $1.16 \times 10^{-9}$.

The in-plane uniformity of the film thickness of the thus obtained silica-based coating film was also evaluated. This in-plane uniformity was measured using an automated ellipsometer "DHA-XA2" manufactured by Mizojiri Optical Co., Ltd., by measuring the film thickness at 9 points within the plane of the coating film, and then calculating the uniformity using the formula shown below.

(Maximum value−minimum value)/(2×average value)×100(%)

The result of this evaluation revealed a film thickness in-plane uniformity of 0.5%.

Furthermore, the storage stability was also evaluated by using GPC to measure the weight average molecular weight of the composition for forming a silica-based coating film, first immediately following preparation, and then following standing for two days at room temperature. The results revealed a molecular weight of 1810 immediately following preparation, and a weight average molecular weight of 1870 after standing for two days, which represents no substantial change and indicates a high degree of storage stability.

Furthermore, measurement of the hardness and the elastic modulus of the thus obtained silica-based coating film using a "Nano Indenter XP-SA2" apparatus manufactured by MTS Systems Corporation revealed results of 0.5 GPa and 4.0 GPa respectively.

Example 5

With the exception of altering the $RbNO_3$ concentration relative to the solid fraction to 900 ppm, a composition for forming a silica-based coating film was obtained in the same manner as the example 4.

Using this composition for forming a silica-based coating film, the same procedure as the example 4 was used to form a silica-based coating film with a film thickness of approximately 2,500 Å (250 nm).

The dielectric constant of the thus obtained silica-based coating film was 2.20, and the leakage current at 2 MV/cm was $4.53 \times 10^{-10}$.

The film thickness in-plane uniformity was 0.3%.

Furthermore, in terms of the storage stability, the weight average molecular weight was 1830 immediately following preparation, and the weight average molecular weight was 1860 after standing for two days, which represents no substantial change and indicates a high degree of storage stability.

Furthermore, measurement of the hardness and the elastic modulus of the thus obtained silica-based coating film revealed results of 0.6 GPa and 4.2 GPa respectively.

Example 6

With the exception of altering the $RbNO_3$ concentration relative to the solid fraction to 9,000 ppm, a composition for forming a silica-based coating film was obtained in the same manner as the example 4.

Using this composition for forming a silica-based coating film, the same procedure as the example 4 was used to form a silica-based coating film with a film thickness of approximately 3,000 Å (300 nm).

The dielectric constant of the thus obtained silica-based coating film was 2.24, and the leakage current at 2 MV/cm was $1.86 \times 10^{-9}$.

The film thickness in-plane uniformity was 0.7%.

Furthermore, in terms of the storage stability, the weight average molecular weight was 1800 immediately following preparation, and the weight average molecular weight was 1870 after standing for two days, which represents no substantial change and indicates a high degree of storage stability.

Furthermore, measurement of the hardness and the elastic modulus of the thus obtained silica-based coating film revealed results of 0.7 GPa and 4.8 GPa respectively.

Comparative Example 3

With the exception of not adding the 0.1% by weight aqueous solution of $RbNO_3$, a composition for forming a silica-based coating film was obtained in the same manner as the example 4.

Using this composition for forming a silica-based coating film, the same procedure as the example 4 was used to form a silica-based coating film with a film thickness of approximately 2,100 Å (210 nm).

The dielectric constant of the thus obtained silica-based coating film was considerably higher at 3.57, and the leakage current at 2 MV/cm of $7.22 \times 10^{-7}$ was also much higher. Furthermore, the film thickness in-plane uniformity was 2.5%, a significantly inferior result.

Comparative Example 4

With the exception of replacing the $RbNO_3$ from the example 4 with a quantity of $Mg(NO_3)_2$ equivalent to a concentration of 300 ppm relative to the solid fraction, a composition for forming a silica-based coating film was obtained in the same manner as the example 4.

Using this composition for forming a silica-based coating film, the same procedure as the example 4 was used to form a silica-based coating film with a film thickness of approximately 2,500 Å (250 nm).

The dielectric constant of the thus obtained silica-based coating film was considerably higher at 3.30, and the leakage current at 2 MV/cm of $3.22 \times 10^{-6}$ was also much higher.

The silica-based coating film of this comparative example 4 exhibits a higher dielectric constant than the coating films of the examples 4 to 6. In other words, it is clear that the addition of an alkaline earth metal compound yields almost no effect in reducing the dielectric constant.

INDUSTRIAL APPLICABILITY

According to a composition for forming a silica-based coating film of the present invention, a silica-based coating film with a low dielectric constant can be formed. Furthermore, by using a composition for forming a silica-based coating film according to the first aspect of the present invention, a silica-based coating film with a low dielectric constant and a high degree of mechanical strength can be formed. Furthermore, by using a composition for forming a silica-based coating film according to the second aspect of the present invention, a silica-based coating film with a low dielectric constant, favorable electrical properties, and a high degree of film thickness uniformity can be formed.

The invention claimed is:

1. A composition for forming a silica-based coating film, comprising a siloxane polymer and an alkali metal compound, wherein said siloxane polymer is at least one hydrolysis-condensation product of a compound represented by a general formula (1) shown below:

$$R_n SiX_{4-n} \quad (1)$$

(wherein, R represents an organic group of 1 to 20 carbon atoms, X represents an alkoxy group of 1 to 5 carbon atoms, n represents an integer from 0 to 2, a plurality of R groups may be either identical or different, and a plurality of X groups may be either identical or different), wherein said alkali metal compound is selected from the group consisting of alkoxides, halides, acetates and nitrates of sodium, lithium, potassium, rubidium and cesium, and wherein the quantity of said alkali metal compound is within a range from 0.03 to 1 wt % relative to said siloxane polymer in terms of the solid fraction calculated as an equivalent weight of $SiO_2$.

2. A composition for forming a silica-based coating film, comprising a siloxane polymer, an alkali metal compound, and a pore-forming material, wherein said siloxane polymer is at least one hydrolysis-condensation product of a compound represented by a general formula (1) shown below:

$$R_n SiX_{4-n} \quad (1)$$

(wherein, R represents an organic group of 1 to 20 carbon atoms, X represents an alkoxy group of 1 to 5 carbon atoms, n represents an integer from 0 to 2, a plurality of R groups may be either identical or different, and a plurality of X groups may be either identical or different), wherein said alkali metal compound is selected from the group consisting of alkoxides, halides, acetic acid salts and nitrates of sodium, lithium, potassium, rubidium and cesium, and wherein the quantity of said alkali metal compound is within a range from 300 to 10,000 ppm relative to said siloxane polymer in terms of the solid fraction calculated as an equivalent weight of $SiO_2$.

3. A composition for forming a silica-based coating film according to claim 2, wherein said compound represented by said general formula (1) comprises at least a compound in which n=0 within said general formula (1).

4. A composition for forming a silica-based coating film according to claim 2, wherein said alkali metal compound is a rubidium compound or a cesium compound.

5. A composition for forming a silica-based coating film according to claim 2, wherein said pore-forming material is at least one material selected from the group consisting of polyalkylene glycols and alkyl-terminated derivatives of the polyalkylene glycols.

* * * * *